United States Patent
Rowell et al.

(10) Patent No.: US 10,587,050 B2
(45) Date of Patent: Mar. 10, 2020

(54) MEASUREMENT SYSTEM AND METHOD COMPRISING A COMPACT ANTENNA RANGE REFLECTOR

(71) Applicant: Rohde & Schwarz GmbH & Co. KG, Munich (DE)

(72) Inventors: Corbett Rowell, Munich (DE); Benoit Derat, Munich (DE); Vincent Abadie, Hohenschaeftlarn (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 224 days.

(21) Appl. No.: 15/852,607

(22) Filed: Dec. 22, 2017

(65) Prior Publication Data
US 2019/0199002 A1  Jun. 27, 2019

(51) Int. Cl.
| H04B 17/00 | (2015.01) |
| H01Q 19/02 | (2006.01) |
| G01R 29/08 | (2006.01) |
| H01Q 19/17 | (2006.01) |
| H01Q 15/16 | (2006.01) |
| G01R 29/10 | (2006.01) |

(52) U.S. Cl.
CPC ....... *H01Q 19/022* (2013.01); *G01R 29/0864* (2013.01); *H01Q 19/17* (2013.01); *G01R 29/10* (2013.01); *H01Q 15/16* (2013.01)

(58) Field of Classification Search
CPC ...... H04B 17/00; H01Q 19/022; H01Q 19/17; H01B 17/0085; H01B 17/102
See application file for complete search history.

(56) References Cited

U.S. PATENT DOCUMENTS

| 6,339,393 | B1 | 1/2002 | Burnside et al. |
| 8,190,097 | B2* | 5/2012 | Disbrow, Jr. ........ H04B 17/373 |
| | | | 343/869 |
| 8,330,640 | B2 | 12/2012 | Liu |
| 9,671,445 | B2* | 6/2017 | Huynh .................. G01R 29/10 |
| 2013/0027256 | A1* | 1/2013 | Guo .................... H04L 41/0823 |
| | | | 343/703 |

* cited by examiner

*Primary Examiner* — Tuan Pham
(74) *Attorney, Agent, or Firm* — Ditthavong & Steiner, P.C.

(57) ABSTRACT

A measurement system is provided. The measurement system comprises a device under test, at least two measurement antennas, and a reflector. In this context, the reflector comprises at least two separate curved surfaces in the same physical entity in order to generate separate plane waves corresponding to the at least two measurement antennas. The reflector is configured in such a manner that the separate plane waves converge in a quiet-zone comprising the device under test.

18 Claims, 4 Drawing Sheets ns, and a reflector. In this context, the reflector comprises at least two separate curved surfaces in the same physical entity in order to generate separate plane waves corresponding to the at least two measurement antennas, whereas the reflector is configured in such a manner that the separate plane waves converge in a quiet-zone comprising the device under test. Advantageously, the required measurement space is reduced to a minimum, whereas accuracy is increased. Further advantageously, the measurement bandwidth becomes wider.

MEASUREMENT SYSTEM AND METHOD COMPRISING A COMPACT ANTENNA RANGE REFLECTOR

TECHNICAL FIELD

The invention relates to a measurement system and a measurement method for investigating a device under test with respect to its far-field characteristics especially with the aid of a compact antenna range reflector.

BACKGROUND ART

Generally, in times of an increasing number of wireless communication applications such as MIMO (Multiple Input Multiple Output) systems, there is a growing need of a measurement system and a measurement method for investigating devices under test applying such systems with special respect to their far-field characteristics in order to verify their proper functioning.

U.S. Pat. No. 8,330,640 B2 is directed to an anechoic chamber lined with absorber to absorb electromagnetic energy incident upon the absorber and reflector edge interfaces. The chamber comprises a reflector to reflect waves from a source to form a substantially plane wave field in a test zone within the chamber. In some embodiments, the outer periphery of the reflector extends to the interior walls, floor and ceiling of the chamber. The outer periphery of the reflector is embedded in the absorber in some embodiments. Due to the fact that said reflector does only comprise a single curved surface, neither the required measurement space is reduced to a minimum nor the accuracy of the measurement is increased. As a consequence of this, such a measurement is inefficient not only with respect to the required measurement space, and thus regarding costs, but also concerning accuracy.

Accordingly, there is a need to provide a measurement system and a measurement method for investigating a device under test with special respect to its far-field characteristics in an efficient, accurate and cost-saving manner.

SUMMARY OF THE INVENTION

According to a first aspect of the invention, a measurement system is provided. The measurement system comprises a device under test, at least two measurement antennas, and a reflector. In this context, the reflector comprises at least two separate curved surfaces in the same physical entity in order to generate separate plane waves corresponding to the at least two measurement antennas, whereas the reflector is configured in such a manner that the separate plane waves converge in a quiet-zone comprising the device under test. Advantageously, the required measurement space is reduced to a minimum, whereas accuracy is increased. Further advantageously, the measurement bandwidth becomes wider.

In this context, it might be further preferred and advantageous if the roughness of the reflector, especially of the two separate curved surfaces, is lower or equal, preferably lower, than the measurement wavelength divided by 100, preferably divided by 150.

According to a first preferred implementation form of the first aspect, the separate plane waves are generated at different angles. Advantageously, efficiency is further increased.

According to a further preferred implementation form of the first aspect, the measurement system further comprises a signal analysis unit, which is configured to communicate with the device under test with the aid of electromagnetic waves radiated and/or received by the at least two measurement antennas and redirected by the reflector. Advantageously, this allows for active measurements with special respect to the far-field characteristics of the device under test.

According to a further preferred implementation form of the first aspect, the signal analysis unit is further configured to simulate a base station in order to measure throughput, especially throughput with respect to multiple input multiple output characteristics, of the device under test. Advantageously, far-field characteristics of the device under test are investigate in more detail.

According to a further preferred implementation form of the first aspect, a boundary surface between the at least two separate curved surfaces comprises a triangular mesh in order to reduce or scatter potential interferences. Additionally or alternatively, a boundary surface between the at least two separate curved surfaces comprises an ellipsoidal curve in order to reduce or scatter potential interferences. Advantageously, accuracy is further increased.

According to a further preferred implementation form of the first aspect, at least one or each of the at least two separate curved surfaces of the reflector is formed by a portion of or completely by a paraboloid surface. Additionally or alternatively, at least one or each of the at least two separate curved surfaces of the reflector is formed by a portion of or completely by a hyperboloid surface. Further additionally or alternatively, at least one or each of the at least two separate curved surfaces of the reflector is formed by a portion of or completely by a spherical surface. Advantageously, said reflector can be produced in a cost-saving and efficient manner.

According to a further preferred implementation form of the first aspect, at least one or each of the at least two separate curved surfaces is a concave reflector. Advantageously, the curved surfaces, and thus the reflector, can be produced in a cost-saving and efficient manner.

According to a further preferred implementation form of the first aspect, at least one or each of the at least two separate curved surfaces is configured to transform a near-field signal into a far-field signal especially in the quiet-zone. Advantageously, the required measurement space is reduced.

According to a further preferred implementation form of the first aspect, the at least two separate curved surfaces of the reflector form an aggregate reflector. Additionally or alternatively, the measurement system further comprises at least one additional reflector being equal to said reflector or said aggregate reflector, wherein said reflector or said aggregate reflector, and the at least one additional reflector are connected to a compound reflector. Especially, said reflector or said aggregate reflector, and the at least one additional reflector are connected in order to form a compound reflector. Advantageously, the characteristics of the aggregate reflector or the compound reflector can precisely be adjusted.

According to a further preferred implementation form of the first aspect, in order to form the aggregate reflector, the at least two separate curved surfaces are connected by a screwed or bolted or glued or welded or riveted or nailed or integral, especially forged integral, or hinged connection. Additionally or alternatively, the connection of the reflector or the aggregate reflector, and the at least one additional reflector is a screwed or bolted or glued or welded or riveted or nailed or integral, especially forged integral, or hinged connection. Advantageously, the characteristics of aggregate reflector resulting from the connection of the at least two separate curved surfaces or the compound reflector resulting from the connection of the reflector and the at least one additional reflector are adjustable or fixedly defined.

According to a further preferred implementation form of the first aspect, in order to form the aggregate reflector, the at least two separate curved surfaces are connected with a hinge in such a manner that the angel between said at least two separate curved surfaces is adjustable. Additionally or alternatively, said reflector or said aggregate reflector, and the at least one additional reflector are connected with a hinge in such a manner that the angel between said reflector or said aggregate reflector, and the at least one additional reflector is adjustable. Advantageously, this allows for an easy and efficient adjustment of the characteristics of aggregate reflector resulting from the connection of the at least two separate curved surfaces or the compound reflector resulting from the connection of the reflector and the at least one additional reflector.

According to a further preferred implementation form of the first aspect, the reflector is milled and/or produced out of one part. Advantageously, said reflector is mechanically particularly stable.

According to a further preferred implementation form of the first aspect, the aggregate reflector is milled and/or produced out of one part. Additionally or alternatively, the at least one additional reflector is milled and/or produced out of one part. Advantageously, said aggregate reflector or said additional reflector is mechanically particularly stable.

According to a further preferred implementation form of the first aspect, the measurement system further comprises a positioning unit, wherein the positioning unit is configured to position the reflector. Advantageously, measurements can be automated.

According to a further preferred implementation form of the first aspect, the measurement system further comprises a positioning unit, wherein the positioning unit is configured to position said reflector and/or said aggregate reflector and/or the at least one additional reflector and/or the compound reflector. Advantageously, measurements can be automated.

According to a further preferred implementation form of the first aspect, the measurement system further comprises a shielded room or chamber. Advantageously, accuracy is increased.

According to a further preferred implementation form of the first aspect, at least the device under test, the at least two measurement antennas, and the reflector are within the shielded room or chamber. Advantageously, major interferences are avoided.

According to a second aspect of the invention, a measurement method is provided. The measurement method comprises the steps of communicating with a device under test with the aid of electromagnetic waves generated by a signal analysis unit, and radiated and/or received by at least two measurement antennas, and redirected by a reflector, wherein the reflector comprises at least two separate curved surfaces in the same physical entity in order to generate separate plane waves corresponding to the at least two measurement antennas, and configuring the reflector in such a manner that the separate plane waves converge in a quiet-zone comprising the device under test. Advantageously, the required measurement space is reduced to a minimum, whereas accuracy is increased. Further advantageously, the measurement bandwidth becomes wider.

In this context, it might be further preferred and advantageous if the roughness of the reflector, especially of the two separate curved surfaces, is lower or equal, preferably lower, than the measurement wavelength divided by 100, preferably divided by 150.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
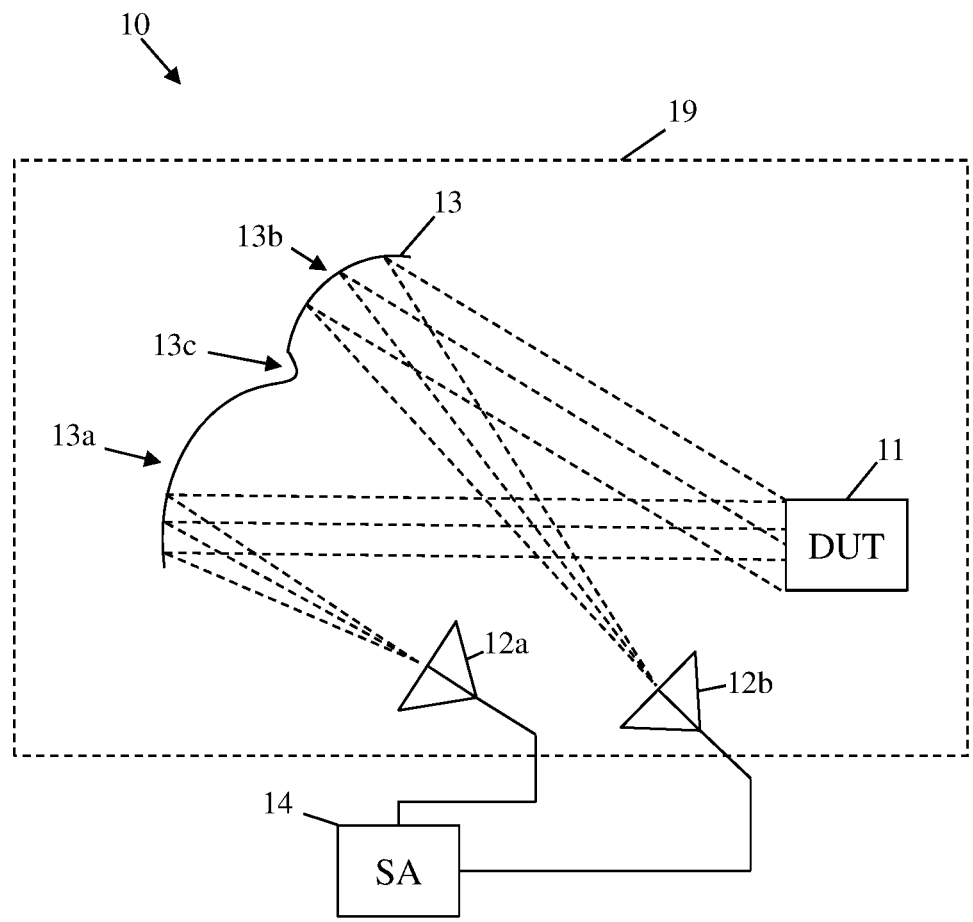
FIG. 1 shows a first exemplary embodiment of the first aspect of the invention.

Firstly, FIG. 1 illustrates a first embodiment of a measurement system 10 according to the invention. Said measurement system 10 comprises a device under test 11, two measurement antennas 12a, 12b, a reflector 13, and a signal analysis unit 14 connected to said two measurement antennas 12a, 12b.

Furthermore, said signal analysis unit 14 may preferably be configured to communicate with the device under test 11 with the aid of electromagnetic waves radiated and/or received by the two measurement antennas 12a, 12b and redirected by the reflector 13. Additionally or alternatively, the signal analysis unit 14 may further be configured to simulate a base station in order to measure throughput, especially throughput with respect to multiple input multiple output characteristics, of the device under test 11.

With respect to the reflector 13, the reflector 13 comprises two separate curved surfaces 13a, 13b especially in the same physical entity in order to generate separate plane waves corresponding to the two measurement antennas 12a, 12b. In this context, the reflector 13 may preferably be configured in such a manner that the separate plane waves converge in a quiet-zone comprising the device under test 11. In addition to this, as it can be seen, the separate plane waves may preferably be generated at different angles.

Moreover, a boundary surface 13c between the two separate curved surfaces 13a, 13b of the reflector may preferably comprises a triangular mesh in order to reduce or scatter potential interferences. Additionally or alternatively, the boundary surface 13c of the reflector 13 between the two separate curved surfaces 13a, 13b may further comprise an ellipsoidal curve in order to reduce or scatter potential interferences.

With respect to the curved surfaces 13a, 13b of the reflector 13, it is noted that at least one or each of the two separate curved surfaces 13a, 13b of the reflector 13 may preferably be formed by a portion of or completely by a paraboloid surface and/or a hyperboloid surface and/or a spherical surface. Additionally or alternatively, at least one or each of the two separate curved surfaces 13a, 13b may be a concave reflector. Further additionally or alternatively, at least one or each of the two separate curved surfaces 13a, 13b of the reflector may be configured to transform a near-field signal into a far-field signal especially in the quiet-zone comprising the device under test 11. With respect to the reflector 13, it is further noted that the reflector 13 may preferably be milled and/or produced out of one part.

Furthermore, according to FIG. 1, the measurement system further comprises a shielded room or chamber 19, wherein especially at least the device under test 11, the two measurement antennas 12a, 12b, and the reflector 13 may be within the shielded room or chamber 19.

Figure 2:
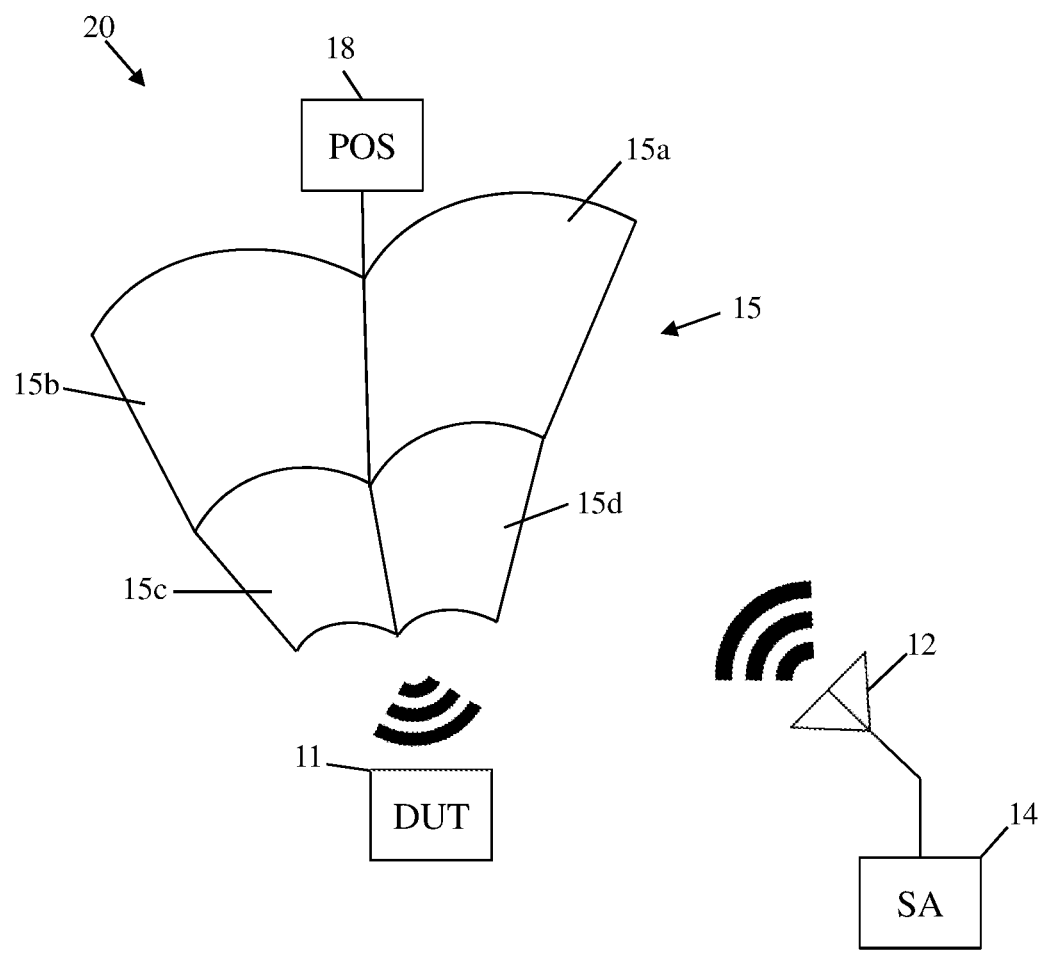
FIG. 2 shows a second exemplary embodiment of the first aspect of the invention.

Now, with respect to FIG. 2, a second embodiment of the inventive measurement system 20 is shown. In this case, contrary to the first embodiment according to FIG. 1, a single measurement antenna 12—in general, at least one measurement antenna—is used.

In this second exemplary embodiment, the measurement system 20 further comprises three additional reflectors 15b, 15c, 15d, whereas reflector 15a may be a reflector according to reflector 13 of FIG. 1. Preferably, said additional reflectors 15b, 15c, 15d may be equal to the reflector 15a, wherein said reflector 15a and the additional reflectors 15b, 15c, 15d are connected to a compound reflector 15. In this context, the connection of the reflector 15a and the additional reflectors 15b, 15c, 15d may preferably be a screwed or bolted or glued or welded or riveted or nailed or integral, especially forged integral, or hinged connection.

Additionally or alternatively, said reflector 15a and at least one of the additional reflectors 15b, 15c, 15d may preferably be connected with a hinge in such a manner that the angel between said reflector 15a and the at least one of the additional reflectors 15b, 15c, 15d is adjustable.

In further addition or as a further alternative, the reflector 15a may be milled and/or produced out of one part. 13. Moreover, the at least one of the additional reflectors 15b, 15c, 15d may preferably be milled and/or produced out of one part.

As it can be seen from FIG. 2, the measurement system 20 further comprises a positioning unit 18, wherein the positioning unit 18 may preferably be configured to position said reflector 15a and/or at least one of the additional reflectors 15b, 15c, 15d and/or the compound reflector 15 especially as a whole. In this context, it is noted that such a positioning unit 18 would be also suitable for positioning the reflector 13 of the first exemplary embodiment of the measurement system 10 according to FIG. 1.

In addition to this, it is noted that at least two of the reflector 15a and the additional reflectors 15b, 15c, 15d may preferably have different focal lengths.

Figure 3:
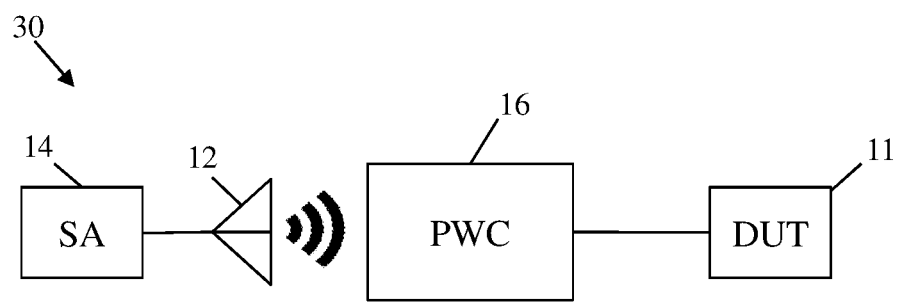
FIG. 3 shows a third exemplary embodiment of the first aspect of the invention.

Now, with the aid of FIG. 3, a third exemplary embodiment of the measurement system 30 is illustrated. In this exemplary case, the measurement antenna 12 connected to the signal analysis unit 14 wirelessly communicates with a plane wave converter 16 with the aid of electromagnetic waves.

Said plane wave converter 16 is configured to convert said electromagnetic waves into plane waves and to pass said plane waves to the device under test 11. Preferably, the plane wave converter 16 may connected to the device under test 11 via cable, especially via coaxial cable.

Figure 4:
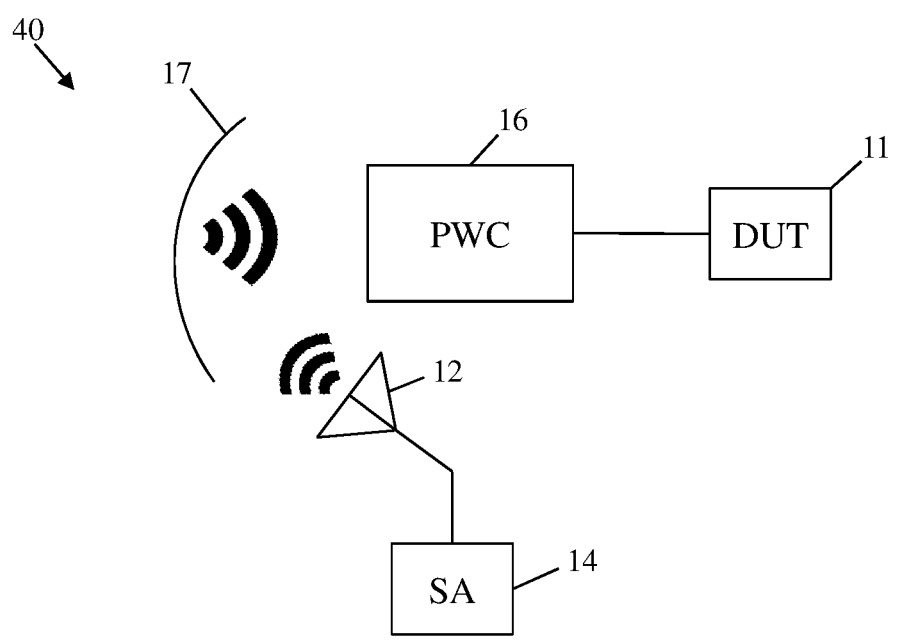
FIG. 4 shows a fourth exemplary embodiment of the first aspect of the invention.

Moreover, FIG. 4 depicts a fourth exemplary embodiment of the measurement system 40 which especially is a further implementation form of the third exemplary embodiment according to FIG. 3. In contrast to the measurement system 30, according to the measurement system 40, the measurement antenna 12 does not directly communicate with the plane wave converter 16 but does rather indirectly communicate via a reflector 17 with the plane wave converter 16.

In this context, it is noted that said reflector 17 of the measurement system 40 according to FIG. 4 may preferably be a reflector according to reflector 13 of the measurement system 10 of FIG. 1 or according to the compound reflector 15 of the measurement system 20 of FIG. 2.

Figure 5:
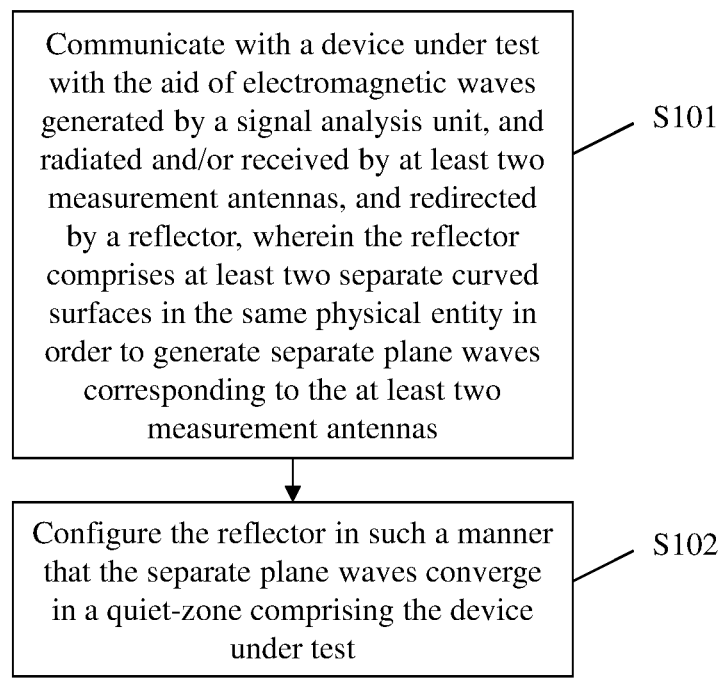
FIG. 5 shows a flow chart of an exemplary embodiment of the second aspect of the invention.

Finally, FIG. 5 shows a flow chart of the inventive method. In a first step S101, it is communicated with a device under test with the aid of electromagnetic waves generated by a signal analysis unit, and radiated and/or received by at least two measurement antennas, and redirected by a reflector, wherein the reflector comprises at least two separate curved surfaces in the same physical entity in order to generate separate plane waves corresponding to the at least two measurement antennas. Then, in a second step S102, the reflector is configured in such a manner that the separate plane waves converge in a quiet-zone comprising the device under test.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measurement system comprising:
   a device under test,
   at least two measurement antennas, and
   a reflector,
   wherein the reflector comprises at least two separate curved surfaces in the same physical entity in order to generate separate plane waves corresponding to the at least two measurement antennas, and
   wherein the reflector is configured in such a manner that the separate plane waves converge in a quiet-zone comprising the device under test.

2. The measurement system according to claim 1,
   wherein the separate plane waves are generated at different angles.

3. The measurement system according to claim 1,
   wherein the measurement system further comprises a signal analysis unit, which is configured to communicate with the device under test with the aid of electromagnetic waves radiated and/or received by the at least two measurement antennas and redirected by the reflector.

4. The measurement system according to claim 3,
   wherein the signal analysis unit is further configured to simulate a base station in order to measure throughput, especially throughput with respect to multiple input multiple output characteristics, of the device under test.

5. The measurement system according to claim 1,
wherein a boundary surface between the at least two separate curved surfaces comprises a triangular mesh in order to reduce or scatter potential interferences, and/or
wherein a boundary surface between the at least two separate curved surfaces comprises an ellipsoidal curve in order to reduce or scatter potential interferences.

6. The measurement system according to claim 1,
wherein at least one or each of the at least two separate curved surfaces of the reflector is formed by a portion of or completely by a paraboloid surface and/or a hyperboloid surface and/or a spherical surface.

7. The measurement system according to claim 1,
wherein at least one or each of the at least two separate curved surfaces is a concave reflector.

8. The measurement system according to claim 1,
wherein at least one or each of the at least two separate curved surfaces is configured to transform a near-field signal into a far-field signal especially in the quiet-zone.

9. The measurement system according to claim 1,
wherein the at least two separate curved surfaces of the reflector form an aggregate reflector, and/or
wherein the measurement system further comprises at least one additional reflector being equal to said reflector or said aggregate reflector, wherein said reflector or said aggregate reflector, and the at least one additional reflector are connected to a compound reflector.

10. The measurement system according to claim 9,
wherein in order to form the aggregate reflector, the at least two separate curved surfaces are connected by a screwed or bolted or glued or welded or riveted or nailed or integral, especially forged integral, or hinged connection, and/or
wherein the connection of the reflector or the aggregate reflector, and the at least one additional reflector is a screwed or bolted or glued or welded or riveted or nailed or integral, especially forged integral, or hinged connection.

11. The measurement system according to claim 9,
wherein in order to form the aggregate reflector, the at least two separate curved surfaces are connected with a hinge in such a manner that the angle between said at least two separate curved surfaces is adjustable, and/or
wherein said reflector or said aggregate reflector, and the at least one additional reflector are connected with a hinge in such a manner that the angle between said reflector and the at least one additional reflector is adjustable.

12. The measurement system according to claim 1,
wherein the reflector is milled and/or produced out of one part.

13. The measurement system according to claim 9,
wherein the aggregate reflector is milled and/or produced out of one part, and/or
wherein the at least one additional reflector is milled and/or produced out of one part.

14. The measurement system according to claim 1,
wherein the measurement system further comprises a positioning unit, wherein the positioning unit is configured to position the reflector.

15. The measurement system according to claim 9,
wherein the measurement system further comprises a positioning unit, wherein the positioning unit is configured to position said reflector and/or said aggregate reflector and/or the at least one additional reflector and/or the compound reflector.

16. The measurement system according to claim 1,
wherein the measurement system further comprises a shielded room or chamber.

17. The measurement system according to claim 16,
wherein at least the device under test, the at least two measurement antennas, and the reflector are within the shielded room or chamber.

18. A measurement method comprising the steps of:
communicating with a device under test with the aid of electromagnetic waves generated by a signal analysis unit, and radiated and/or received by at least two measurement antennas, and redirected by a reflector, wherein the reflector comprises at least two separate curved surfaces in the same physical entity in order to generate separate plane waves corresponding to the at least two measurement antennas, and
configuring the reflector in such a manner that the separate plane waves converge in a quiet-zone comprising the device under test.

* * * * *